US009502382B2

(12) United States Patent
Cho et al.

(10) Patent No.: US 9,502,382 B2
(45) Date of Patent: Nov. 22, 2016

(54) COPLANER WAVEGUIDE TRANSITION

(75) Inventors: Young Seek Cho, West Lafayette, IN (US); Rhonda Rene Franklin, Falcon Heights, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 998 days.

(21) Appl. No.: 13/245,389

(22) Filed: Sep. 26, 2011

(65) Prior Publication Data
US 2013/0075904 A1 Mar. 28, 2013

(51) Int. Cl.
| | |
|---|---|
| H01P 5/04 | (2006.01) |
| H01P 5/18 | (2006.01) |
| H01L 25/065 | (2006.01) |
| H01P 1/04 | (2006.01) |
| H01P 5/02 | (2006.01) |
| H01P 11/00 | (2006.01) |
| H01L 23/00 | (2006.01) |
| H01L 23/538 | (2006.01) |

(52) U.S. Cl.
CPC ........... *H01L 25/0657* (2013.01); *H01P 1/047* (2013.01); *H01P 5/022* (2013.01); *H01P 11/003* (2013.01); *H01L 23/5384* (2013.01); *H01L 24/16* (2013.01); *H01L 2223/6616* (2013.01); *H01L 2223/6633* (2013.01); *H01L 2223/6683* (2013.01); *H01L 2224/131* (2013.01); *H01L 2224/16225* (2013.01); *H01L 2224/16227* (2013.01); *H01L 2224/17181* (2013.01); *H01L 2225/06572* (2013.01)

(58) Field of Classification Search
CPC ............. H01L 29/7606; H01L 29/775; H01L 2924/13071; H01L 27/265; H01L 47/02; H01L 2224/16055; H01L 25/0657; H01L 25/043; H01L 25/074; H01L 25/0756; H01L 25/117; H01L 27/3209; Y10S 977/936; Y10S 977/937; Y10S 977/938; H01P 7/00; H01P 11/00; H01P 1/047; H01P 1/268; H01P 5/085; H01P 5/107
USPC ................................................. 333/243, 260
See application file for complete search history.

(56) References Cited

U.S. PATENT DOCUMENTS

| | | | |
|---|---|---|---|
| 5,644,277 A | | 7/1997 | Gulick et al. |
| 5,675,302 A | * | 10/1997 | Howard ................. H01P 1/047 333/243 |
| 5,930,665 A | * | 7/1999 | Cho et al. .................... 438/612 |

(Continued)

OTHER PUBLICATIONS

"A Broadband Vertical Transition for Millimeter-Wave Applications", Alexander Stark, et al., 32nd European Microwave Conference, pp. 402-406, Oct. 2008.

(Continued)

*Primary Examiner* — Mary Wilczewski
*Assistant Examiner* — Tsz Chiu
(74) *Attorney, Agent, or Firm* — Dicke, Billig & Czaja, PLLC

(57) ABSTRACT

A coplanar waveguide transition includes a substrate, a first coplanar waveguide on a first side of the substrate, and a second coplanar waveguide on a second side of the substrate. The coplanar waveguide transition includes a first, a second, and a third via through the substrate electrically coupling the first coplanar waveguide to the second coplanar waveguide. The coplanar waveguide transition includes voids through the substrate between the first, second, and third vias and edges of the first coplanar waveguide and edges of the second coplanar waveguide.

19 Claims, 4 Drawing Sheets

(56) References Cited

U.S. PATENT DOCUMENTS

| | | | |
|---|---|---|---|
| 6,100,775 A | | 8/2000 | Wen |
| 6,207,903 B1 | | 3/2001 | Wen et al. |
| 6,215,377 B1 | * | 4/2001 | Douriet ................ 333/247 |
| 6,396,363 B1 | * | 5/2002 | Alexanian et al. ........ 333/26 |
| 6,469,383 B1 | | 10/2002 | Welstand |
| 2002/0075105 A1 | * | 6/2002 | Douriet et al. ............ 333/247 |
| 2002/0118083 A1 | * | 8/2002 | Pergande ................. 333/246 |
| 2002/0156588 A1 | * | 10/2002 | Arndt et al. .................. 702/40 |
| 2002/0164107 A1 | * | 11/2002 | Boudreau ......... G02B 6/12004 385/14 |
| 2003/0107459 A1 | * | 6/2003 | Takahashi et al. ........ 333/230 |
| 2003/0112576 A1 | * | 6/2003 | Brewer ............... G03F 7/0002 361/119 |
| 2003/0198032 A1 | * | 10/2003 | Collander .......... H01L 23/5387 361/760 |
| 2004/0155723 A1 | * | 8/2004 | Koriyama .................... 333/26 |
| 2006/0017650 A1 | * | 1/2006 | Allen et al. .................. 343/900 |
| 2006/0226928 A1 | * | 10/2006 | Henning ............ H05K 1/0222 333/33 |
| 2009/0051467 A1 | * | 2/2009 | McKinzie, III ............ 333/219 |
| 2011/0234472 A1 | * | 9/2011 | Maurer ................ H01L 23/66 343/904 |
| 2011/0273228 A1 | * | 11/2011 | Kolias et al. ................. 327/564 |
| 2012/0032320 A1 | * | 2/2012 | Chao ................ H01L 21/4846 257/734 |

OTHER PUBLICATIONS

"Characterization and Modeling of a New Via Structure in Multilayered Printed Circuit Boards", DaeHan Kwon, et al., IEEE 2003.

"Designs for Broad-Band Microstrip Vertical Transitions Using Cavity Couplers", Eric S. Lee, IEEE trans. Microwave Theory Tech., vol. 54, No. 1, pp. 464-472, Jan. 2006.

"Ultra-Wideband Silicon Through-Wafer Transmission Lines", Daniel T. Kollmann, et al., IEEE MTT-S Int. Microwave Symp. Dig., pp. 489-492, Jun. 2004.

"Vertical Silicon K-Band CPW Through-Wafer Interconnects", M. Reimann, et al., 1999 29th European Microwave Conference, pp. 23-26, Sep. 2002.

"W-Band Micromachined Vertical Interconnection for Three-Dimensional Microwave ICs", Katherine J. Herrick, et al., 32nd European Microwave Conference, pp. 402-406, Sep. 1999.

* cited by examiner

COPLANER WAVEGUIDE TRANSITION

BACKGROUND

Three dimensional packaging is considered as a promising packaging solution that can offer small form factor and high performance capability to high-speed electronics. The high speed electronics may include multi-functional wireless communication devices in which a variety of analog and digital circuits, such as high performance computing functional blocks, image sensors, display units, and multi-band radios are integrated. To implement multi-functional devices with excellent performance, seamless packaging strategies are required.

As the operating frequency of communication devices moves toward the millimeter wave band, demand for low cost, compact, and high performance packaging strategies continues to increase. To electrically connect semiconductor chips, such as memory, Central Processing Units (CPUs), Digital Signal Processors (DSPs), or Monolithic Microwave Integrated Circuits (MMICs), to each other and/or to substrates, such as semiconductor substrates, ceramic substrates, or laminate substrates, wire bonding is typically used. As the operating frequency of analog and mixed signal chips reach the millimeter-wave frequency band, wire bonds hinder the performance of a packaged chip due to the parasitic inductance. In addition, wire bonds consume real estate in the package because of the physical length of the wires between the chip and the package substrate.

For these and other reasons, there is a need for the present invention.

SUMMARY

One embodiment provides a coplanar waveguide transition. The coplanar waveguide transition includes a substrate, a first coplanar waveguide on a first side of the substrate, and a second coplanar waveguide on a second side of the substrate. The coplanar waveguide transition includes a first, a second, and a third via through the substrate electrically coupling the first coplanar waveguide to the second coplanar waveguide. The coplanar waveguide transition includes voids through the substrate between the first, second, and third vias and edges of the first coplanar waveguide and edges of the second coplanar waveguide.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the disclosure may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present disclosure. The following detailed description, therefore, is not to be taken in a limiting sense, and the scope of the present disclosure is defined by the appended claims.

It is to be understood that the features of the various exemplary embodiments described herein may be combined with each other, unless specifically noted otherwise.

As used herein, the term "electrically coupled" is not meant to mean that the elements must be directly coupled together and intervening elements may be provided between the "electrically coupled" elements.

Figure 1:
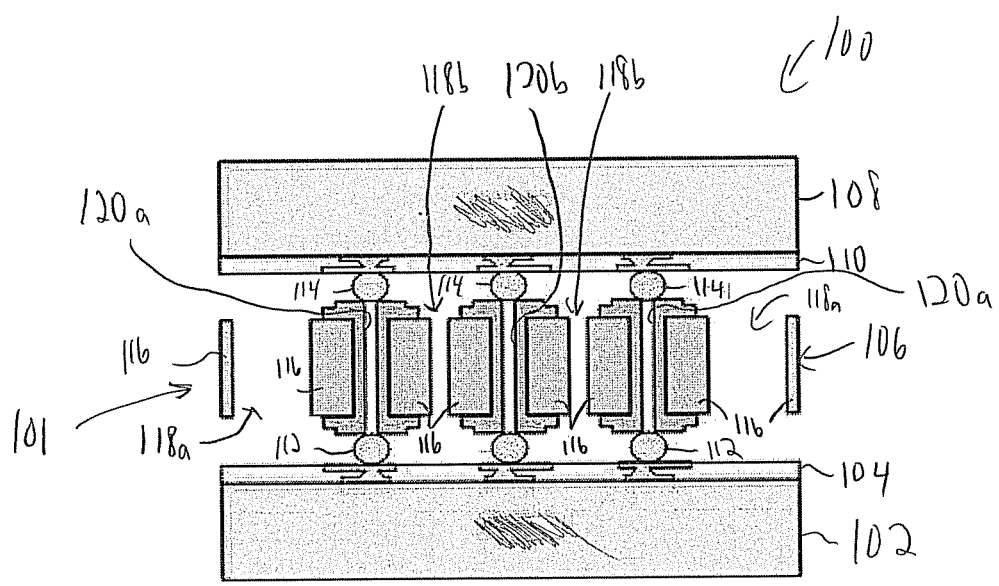
FIG. 1 illustrates a cross-sectional view of one embodiment of a semiconductor device.

FIG. 1 illustrates a cross-sectional view of one embodiment of a semiconductor device 100. Semiconductor device 100 includes a first semiconductor chip 102 including a redistribution layer 104, a trenched coplanar waveguide (CPW) through silicon via (TSV) transition 101, a second semiconductor chip 108 including a redistribution layer 110, and solder balls 112 and 114. Redistribution layer 104 of first semiconductor chip 102 is electrically coupled to the bottom of trenched CPW-TSV transition 101 through solder balls 112. Redistribution layer 110 of second semiconductor chip 108 is electrically coupled to the top of trenched CPW-TSV transition 101 through solder balls 114.

First semiconductor chip 102 is electrically coupled to second semiconductor chip 108 through trenched CPW-TSV transition 101. Trenched CPW-TSV transition 101 has an operating bandwidth of up to 110 GHz. Trenched CPW-TSV transition 101 operates from DC to W-band (i.e., 75-110 GHz) with high return loss and low insertion loss as well as enabling a wide range of characteristic impedance values to match a variety of system impedances. Trenched CPW-TSV transition 101 incorporates air trenches and truncated ground planes of the CPW in the transition region. In one embodiment, the operating bandwidth of the return loss above 15 dB in trenched CPW-TSV transition 101 is 100 GHz, which is an 80% improvement when compared to conventional structures.

First semiconductor chip 102 and second semiconductor chip 108 can include any one or a combination of memory, Central Processing Units (CPUs), Digital Signal Processors (DSPs), Monolithic Microwave Integrated Circuits (MMICs), and/or other suitable circuits. In other embodiments, first semiconductor chip 102 or second semiconductor chip 108 can be replaced with another suitable substrate, such as a ceramic substrate or a laminate substrate (e.g., printed circuit board).

Trenched CPW-TSV transition 101 includes a substrate 106 including substrate portions 116, air trenches or voids 118a and 118b, and vias 120a and 120b. The top of vias 120a are electrically coupled to ground planes of the upper CPW on the upper surface of substrate 106. The bottom of vias 120a are electrically coupled to ground planes of the lower CPW on the lower surface of substrate 106. The top of via 120b is electrically coupled to a signal line of the upper CPW on the upper surface of substrate 106. The bottom of via 120b is electrically coupled to a signal line of the lower CPW on the bottom surface of substrate 106. Vias 120a and 120b are hollow such that they have a square or cylindrical or pipe shape. Air trenches 118a extend through substrate 106 between vias 120a and the outer edges of the ground planes of the upper CPW and the lower CPW. Air trenches 118b extend through substrate 106 between via 120b and vias 120a.

Figure 2A:
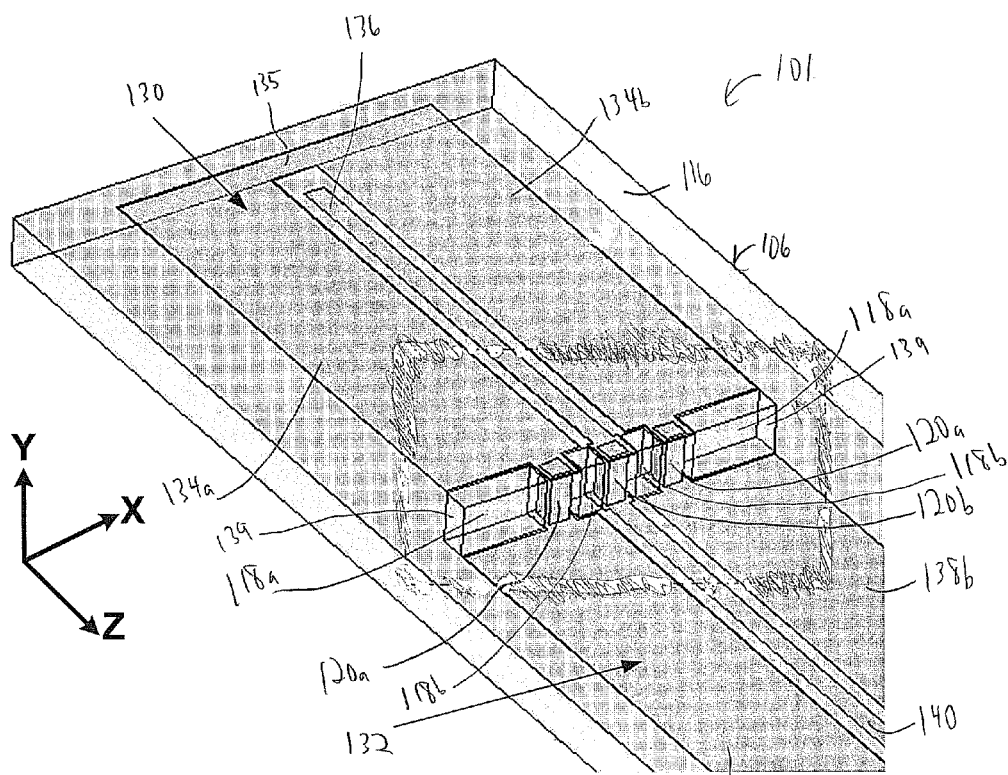
FIGS. 2A and 2B illustrate perspective views of one embodiment of a coplanar waveguide transition.
Figure 2B:
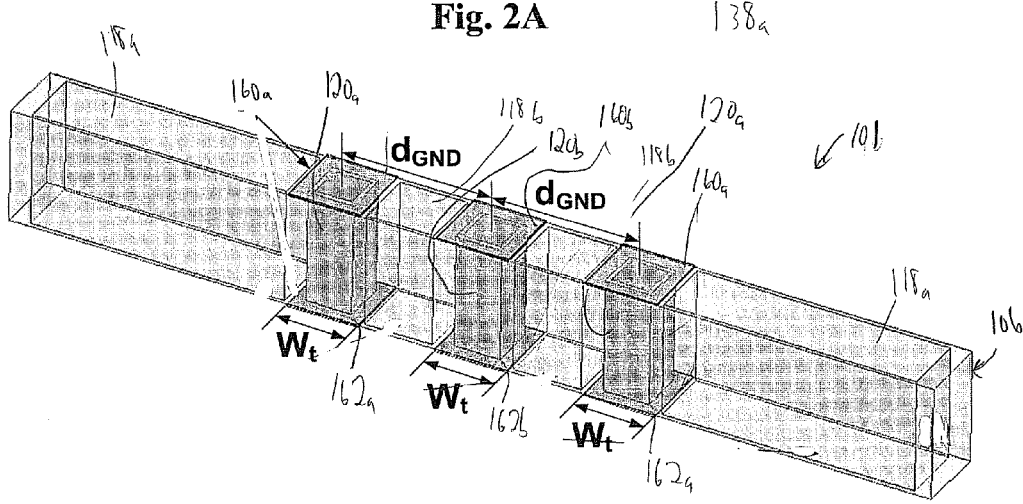

FIGS. 2A and 2B illustrate perspective views of one embodiment of trenched CPW-TSV transition 101 previously described and illustrated with reference to FIG. 1. Trenched CPW-TSV transition 101 includes substrate 106, a first CPW 130 on the upper surface of substrate 106, a second CPW 132 on the lower surface of substrate 106, vias 120a and 120b, and air trenches or voids 118a and 118b.

First CPW 130 includes a three conductor coplanar transmission line structure including a first ground plane 134a, a second ground plane 134b, and a signal line 136. Signal line 136 is between and runs parallel to first ground plane 134a and second ground plane 134b. First ground plane 134a is electrically coupled to second ground plane 134b at 135. The widths of first ground plane 134a and second ground plane 134b along the x-axis are substantially equal to each other and are greater than the width of signal line 136 along the x-axis. An edge of first ground plane 134a and an edge of second ground plane 134b are each electrically coupled to a respective via pad 160a, and an edge of signal line 136 is electrically coupled to a via pad 160b. First ground plane 134a and second ground plane 134b are truncated such that they do not extend into the transition region where via pads 160a and 160b, vias 120a and 120b, and air trenches 118a and 118b are arranged.

Second CPW 132 includes a three conductor coplanar transmission line structure including a first ground plane 138a, a second ground plane 138b, and a signal line 140. Signal line 140 is between and runs parallel to first ground plane 138a and second ground plane 138b. First ground plane 138a is electrically coupled to second ground plane 138b (not shown). The widths of first ground plane 138a and second ground plane 138b along the x-axis are substantially equal to each other and are greater than the width of signal line 140 along the x-axis. An edge of first ground plane 138a and an edge of second ground plane 138b are each electrically coupled to a respective via pad 162a, and an edge of signal line 140 is electrically coupled to a via pad 162b. First ground plane 138a and second ground plane 138b are truncated such that they do not extend into the transition region where via pads 162a and 162b, vias 120a and 120b, and air trenches 118a and 118b are arranged.

Each via 120a extends between a via pad 160a and a via pad 162a along the y-axis through substrate 106. Via 120b extends between via pad 160b and via pad 162b along the y-axis through substrate 106. First ground plane 134a of CPW 130 is electrically coupled to first ground plane 138a of CPW 132 through a via pad 160a, a via 120a, and a via pad 162a. Second ground plane 134b of CPW 130 is electrically coupled to second ground plane 138b of CPW 132 through another via pad 160a, via 120a, and via pad 162a. The width ($W_t$) of each via pad 160a, 160b, 162a, and 162b is greater than the width of each via 120a and 120b such that each via pad 160a, 160b, 162a, and 162b extends over a portion of substrate 106. In one embodiment, the width ($W_t$) is between 85 μm and 125 μm. Via 120b is spaced apart from each via 120a by a distance ($d_{GND}$). The distance ($d_{GND}$) sets the characteristic impedance value for trenched CPW-TSV transition 101. In one embodiment, the distance ($d_{GND}$) is about 257.5 μm to provide an impedance of about 50.2Ω.

One of the air trenches 118a extends between a via 120a and an edge of first ground plane 134a of CPW 130 and an edge of first ground plane 138a of CPW 132. The other one of the air trenches 118a extends between the other via 120a and an edge of second ground plane 134b of CPW 130 and an edge of second ground plane 138b of CPW 132. In one embodiment, the outer walls of each air trench 118a along the z-axis are aligned with the outer edges of each ground plane 134a and 138a and ground planes 134b and 138b, respectively, as indicated at 139. Each air trench 118b extends between a via pad 160a and via pad 160b. In addition, one of the air trenches 118b extends along the z-axis between an edge of first ground plane 134a of CPW 130 and an edge of first ground plane 138a of CPW 132. The other one of the air trenches 118b extends along the z-axis between an edge of second ground plane 134b of CPW 130 and an edge of second ground plane 138b of CPW 132. In one embodiment, the width of air trenches 118a along the x-axis is greater than the width of air trenches 118b along the x-axis. In one embodiment, the volume of each air trench 118a is different from the volume of each air trench 118b. In one embodiment, the volume of each air trench 118a is greater than the volume of each air trench 118b.

The following FIGS. 3-11 illustrate one embodiment of a method for fabricating a coplanar waveguide transition, such as coplanar waveguide transition 101 previously described and illustrated with reference to FIGS. 1-2B.

Figure 3:
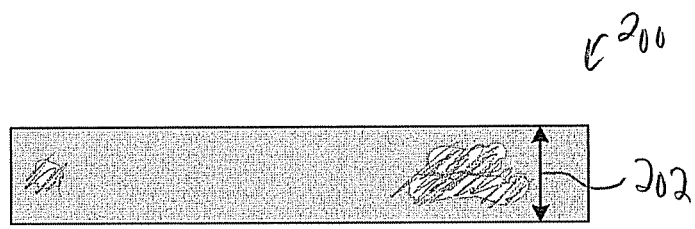
FIG. 3 illustrates a cross-sectional view of one embodiment of a substrate.

FIG. 3 illustrates a cross-sectional view of one embodiment of a substrate 200. In one embodiment, substrate 200 is a silicon substrate, such as a double-side polished high resistivity (e.g., n-type, 4300-6000 Ω·cm) silicon wafer. In other embodiments, substrate 200 is made of another suitable material. Substrate 200 has a thickness as indicated at 202. In one embodiment, the thickness of substrate 200 is up to 200 μm.

Figure 4:
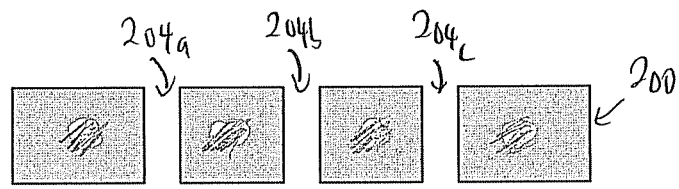
FIG. 4 illustrates a cross-sectional view of one embodiment of the substrate after forming via holes through the substrate.

FIG. 4 illustrates a cross-sectional view of one embodiment of substrate 200 after forming via holes 204a, 204b, and 204c through the substrate. Substrate 200 is structured using Deep Reactive Ion etching (DRIE) or another suitable process to form via holes 204a, 204b, and 204c. In one embodiment, via holes 204a, 204b, and 204c have substantially the same shape and dimensions. Via holes 204a, 204b, and 204c may be square, round, or another suitable shape. In one embodiment, via holes 204a, 204b, and 204c are square and each side has a length between 40 µm and 80 µm. Via holes 204a and 204c are for electrically coupling ground planes that will be formed on each side of substrate 200 while via hole 204b is for electrically coupling signal lines that will be formed on each side of substrate 200.

Figure 5:
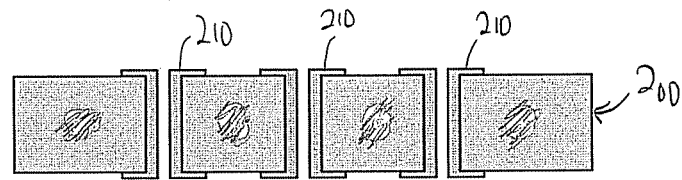
FIG. 5 illustrates a cross-sectional view of one embodiment of the substrate after metallizing the via holes

FIG. 5 illustrates a cross-sectional view of one embodiment of substrate 200 after metallizing via holes 204a, 204b, and 204c. An electroplating process using gold or another suitable material is performed on both sides of substrate 200 to form electrically conductive vias 210 through each via hole 204a, 204b, and 204c. The gold or other suitable material is deposited onto the sidewalls of via holes 204a, 204b, and 204c such that hollow, square or cylindrical, or pipe shaped vias are formed.

Figure 6:
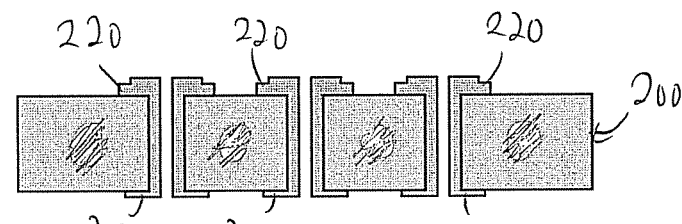
FIG. 6 illustrates a cross-sectional view of one embodiment of the substrate after metallizing the top surface of the substrate.

FIG. 6 illustrates a cross-sectional view of one embodiment of substrate 200 after metallizing the top surface of substrate 200. The top surface of substrate 200 is metallized to form a signal line and ground planes (e.g., CPW 130 previously described and illustrated with reference to FIG. 2A). An electroplating process using gold or another suitable material is performed to form the signal line and ground planes, which are electrically coupled to vias 210 through via pads. In one embodiment, the electroplating process includes depositing seed layers of titanium-gold-titanium (e.g., 600 Å-3000 Å-400 Å) using a sputtering system onto substrate 200. Next, photolithography is used to mask portions of the seed layer that are not to be electroplated. Thereafter, the gold is electroplated onto the exposed portions of the seed layer to provide metallization 220. Finally, the photoresist and underlying seed layers are stripped off and the metallization process is completed. In one embodiment, the thickness of the electroplated gold is approximately 3.5 µm.

Figure 7:
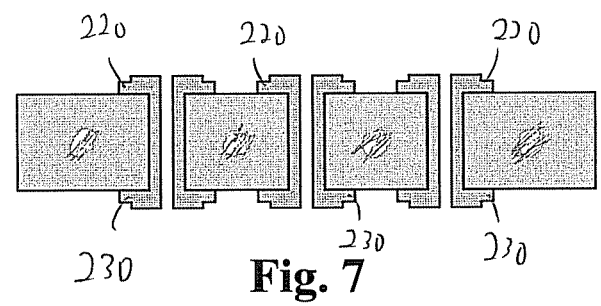
FIG. 7 illustrates a cross-sectional view of one embodiment of the substrate after metallizing the bottom surface of the substrate.

FIG. 7 illustrates a cross-sectional view of one embodiment of substrate 200 after metallizing the bottom surface of substrate 200. The bottom surface of substrate 200 is metallized to form a signal line and ground planes (e.g., CPW 132 previously described and illustrated with reference to FIG. 2A). An electroplating process similar to the process previously described with reference to FIG. 6 is used to provide metallization 230.

Figure 8:
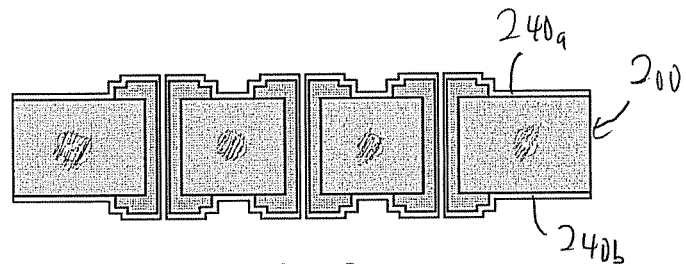
FIG. 8 illustrates a cross-sectional view of one embodiment of the substrate after depositing a dielectric layer on the top surface and on the bottom surface of the substrate.

FIG. 8 illustrates a cross-sectional view of one embodiment of substrate 200 after depositing a dielectric layer on the top surface and on the bottom surface of substrate 200. A first dielectric layer 240a, such as aluminum oxide ($Al_2O_3$) or another suitable dielectric material is deposited onto the top surface of substrate 200, and a second dielectric layer 240b, such as $Al_2O_3$ or another suitable dielectric material is deposited onto the bottom surface of substrate 200. In one embodiment, first dielectric layer 240a and second dielectric layer 240b are deposited onto substrate 200 simultaneously using an Atomic Layer Deposition (ALD) process. In other embodiments, other suitable deposition techniques are used.

Figure 9:
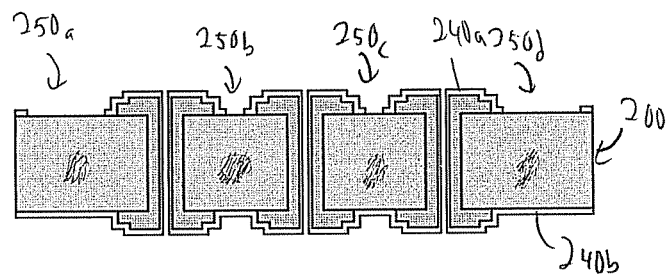
FIG. 9 illustrates a cross-sectional view of one embodiment of the substrate after structuring the dielectric layer on the top surface of the substrate.

FIG. 9 illustrates a cross-sectional view of one embodiment of substrate 200 after structuring dielectric layer 240a on the top surface of substrate 200. Dielectric layer 240a is structured using photolithography and etching processes to expose portions of substrate 200 at 250a, 250b, 250c, and 250d where air trenches (e.g., air trenches 118a and 118b previously described and illustrated with reference to FIGS. 1-2B) will be formed.

Figure 10:
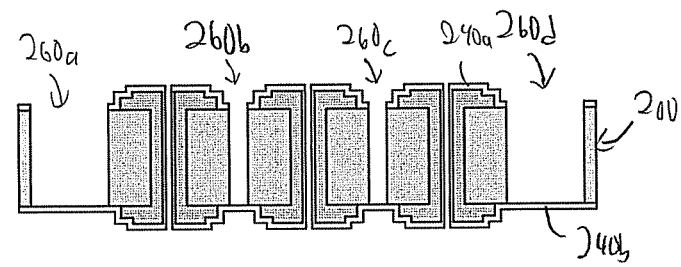
FIG. 10 illustrates a cross-sectional view of one embodiment of the substrate after etching trenches into the substrate.

FIG. 10 illustrates a cross-sectional view of one embodiment of substrate 200 after etching trenches into substrate 200. The exposed portions of substrate 200 at 250a, 250b, 250c, and 250d are etched using Deep Reactive Ion Etching (DRIE) or another suitable etching technique to provide trenches 260a, 260b, 260c, and 260d. Trenches 260a, 260b, 260c, and 260d expose portions of the top of dielectric layer 240b. Trenches 260a and 260d provide air trenches 118a previously described and illustrated with reference to FIGS. 1-2B. Trenches 260b and 260c provide air trenches 118b previously described and illustrated with reference to FIGS. 1-2B.

Figure 11:
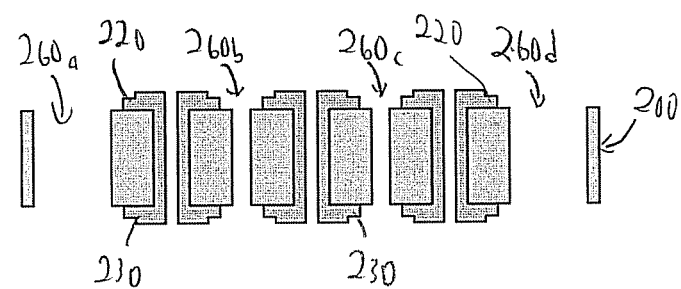
FIG. 11 illustrates a cross-sectional view of one embodiment of the substrate after removing the dielectric layer on the top surface and on the bottom surface of the substrate.

FIG. 11 illustrates a cross-sectional view of one embodiment of substrate 200 after removing the dielectric layers on the top surface and on the bottom surface of substrate 200. Dielectric layer 240b and the remaining portions of dielectric layer 240a are removed to expose metallization 220 and 230. In this way, the fabrication of a trenched CPW-TSV transition is completed.

Embodiments provide a trenched CPW-TSV transition having an operating bandwidth from DC to 110 GHz. The trenched CPW-TSV transition has a high return loss and low insertion loss and can provide a wide range of characteristic values to match a variety of system impedances. The trenched CPW-TSV transition provides a compact in-plane transition that is a seamless packaging scheme for three dimensional stack-up package applications for use in both analog and digital designs.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A coplanar waveguide transition comprising:
    a substrate;
    a first coplanar waveguide on a first side of the substrate;
    a second coplanar waveguide on a second side of the substrate;
    a first, a second, and a third via through the substrate electrically coupling the first coplanar waveguide to the second coplanar waveguide; and
    voids through the substrate between the first, second, and third vias and edges of the first coplanar waveguide and edges of the second coplanar waveguide,
    wherein the voids comprise:
        a first void between the first via and the second via;
        a second void between the second via and the third via;
        a third void between the first via and an edge of the first coplanar waveguide and an edge of the second coplanar waveguide; and
        a fourth void between the third via and an edge of the first coplanar waveguide and an edge of the second coplanar waveguide.

2. The coplanar waveguide transition of claim 1, wherein the first and second voids each have a first volume and the third and fourth voids each have a second volume different from the first volume.

3. The coplanar waveguide transition of claim 1, further comprising:
    a first, a second, and a third via pad on the first side of the substrate, each of the first, second, and third via pads on the first side of the substrate electrically coupled to a respective edge of the first coplanar waveguide; and a first, a second, and a third via pad on the second side of the substrate, each of the first, second, and third via pads on the second side of the substrate electrically coupled to a respective edge of the second coplanar waveguide.

4. The coplanar waveguide transition of claim 1, wherein the first coplanar waveguide comprises:
a first ground plane;
a second ground plane; and
a first signal line between and running parallel to the first ground plane and the second ground plane.

5. The coplanar waveguide transition of claim 1, wherein the substrate comprises silicon.

6. The coplanar waveguide transition of claim 1, wherein the first coplanar waveguide, the second coplanar waveguide, and the first, second, and third vias each comprise gold.

7. The coplanar waveguide transition of claim 1, wherein the coplanar waveguide transition is configured to operate at a bandwidth of up to 110 GHz.

8. A coplanar waveguide transition comprising:
a substrate;
a first ground plane and a second ground plane on a first side of the substrate;
a first signal line on the first side of the substrate, the first signal line between the first ground plane and the second ground plane;
a third ground plane and a fourth ground plane on a second side of the substrate opposite the first side;
a second signal line on the second side of the substrate, the second signal line between the third ground plane and the fourth ground plane;
a first via through the substrate electrically coupling the first signal line to the second signal line;
a second via through the substrate electrically coupling the first ground plane to the third ground plane;
a third via through the substrate electrically coupling the second ground plane to the fourth ground plane;
a first void through the substrate between the first via and the second via;
a second void through the substrate between the first via and the third via;
a third void through the substrate between the second via and an edge of the first ground plane and an edge of the third ground plane; and
a fourth void through the substrate between the third via and an edge of the second ground plane and an edge of the fourth ground plane.

9. The coplanar waveguide transition of claim 8, wherein the first, second, and third vias are hollow.

10. The coplanar waveguide transition of claim 8, wherein the first void, the second void, the third void, and the fourth void each extend from the first side of the substrate to the second side of the substrate.

11. The coplanar waveguide transition of claim 8, wherein the substrate comprises silicon.

12. The coplanar waveguide transition of claim 8, wherein the first and second signal lines, the first, second, third, and fourth ground planes, and the first, second, and third vias each comprise gold.

13. The coplanar waveguide transition of claim 8, wherein the coplanar waveguide transition is configured to operate at a bandwidth of up to 110 GHz.

14. The coplanar waveguide transition of claim 8, wherein a first distance between the first via and the second via and a second distance between the first via and the third via determines a characteristic impedance value of the coplanar waveguide transition.

15. The coplanar waveguide transition of claim 8, wherein the substrate has a thickness up to 200 µm.

16. A semiconductor device comprising:
a first semiconductor chip;
a second semiconductor chip; and
a coplanar waveguide transition electrically coupling the first semiconductor chip to the second semiconductor chip, the coplanar waveguide transition comprising:
a substrate;
a first coplanar waveguide on a first side of the substrate, the first coplanar waveguide electrically coupled to the first semiconductor chip;
a second coplanar waveguide on a second side of the substrate, the second coplanar waveguide electrically coupled to the second semiconductor chip;
a first, a second, and a third via through the substrate electrically coupling the first coplanar waveguide to the second coplanar waveguide; and
voids through the substrate between the first, second, and third vias and edges of the first coplanar waveguide and edges of the second coplanar waveguide, wherein the voids comprise:
a first void between the first via and the second via;
a second void between the second via and the third via;
a third void between the first via and an edge of the first coplanar waveguide and an edge of the second coplanar waveguide; and
a fourth void between the third via and an edge of the first coplanar waveguide and an edge of the second coplanar waveguide.

17. The semiconductor device of claim 16, further comprising:
first solder balls electrically coupling the first coplanar waveguide to the first semiconductor chip; and
second solder balls electrically coupling the second coplanar waveguide to the second semiconductor chip.

18. The semiconductor device of claim 16, wherein the first semiconductor chip comprises a first redistribution layer electrically coupled to the first coplanar waveguide, and
wherein the second semiconductor chip comprises a second redistribution layer electrically coupled to the second coplanar waveguide.

19. The semiconductor device of claim 16, wherein the coplanar waveguide transition is configured to operate at a bandwidth of up to 110 GHz.

* * * * *